United States Patent [19]

Kanuma

[11] Patent Number: 4,887,267
[45] Date of Patent: Dec. 12, 1989

[54] LOGIC INTEGRATED CIRCUIT CAPABLE OF SIMPLIFYING A TEST

[75] Inventor: Akira Kanuma, Yokohama, Japan

[73] Assignee: Kabushiki Kaisha Toshiba, Kawasaki, Japan

[21] Appl. No.: 138,804

[22] Filed: Dec. 28, 1987

[30] Foreign Application Priority Data

May 22, 1987 [JP] Japan ................. 62-125599

[51] Int. Cl.$^4$ ............................................. G06F 11/00
[52] U.S. Cl. .................................. 371/22.3; 371/22.4
[58] Field of Search .................. 371/15, 16, 17, 18, 371/20, 25, 27

[56] References Cited

U.S. PATENT DOCUMENTS

| | | | |
|---|---|---|---|
| 4,194,113 | 3/1980 | Fulks | 371/20 |
| 4,510,572 | 4/1985 | Reece | 371/25 |
| 4,779,042 | 10/1988 | Ugenti | 371/20 |
| 4,788,492 | 11/1988 | Schubert | 371/15 |

OTHER PUBLICATIONS

Eichelberger et al., "A Logic Design Structure for LSI Testability," Proc. Design Automation Workshop 14th, pp. 462–468, ('77).

*Primary Examiner*—Michael R. Fleming
*Attorney, Agent, or Firm*—Finnegan, Henderson, Farabow, Garrett and Dunner

[57] ABSTRACT

A logic integrated circuit includes a FIFO type memory circuit provided for testing. A logic value at each test node is stored in the memory circuits during a write-in enable period set by a control signal from a flip-flop or an externally supplied control signal, and the memory data is read out from the memory circuits, to trace the output states of internal bus, register, multiplier, and the like.

12 Claims, 8 Drawing Sheets

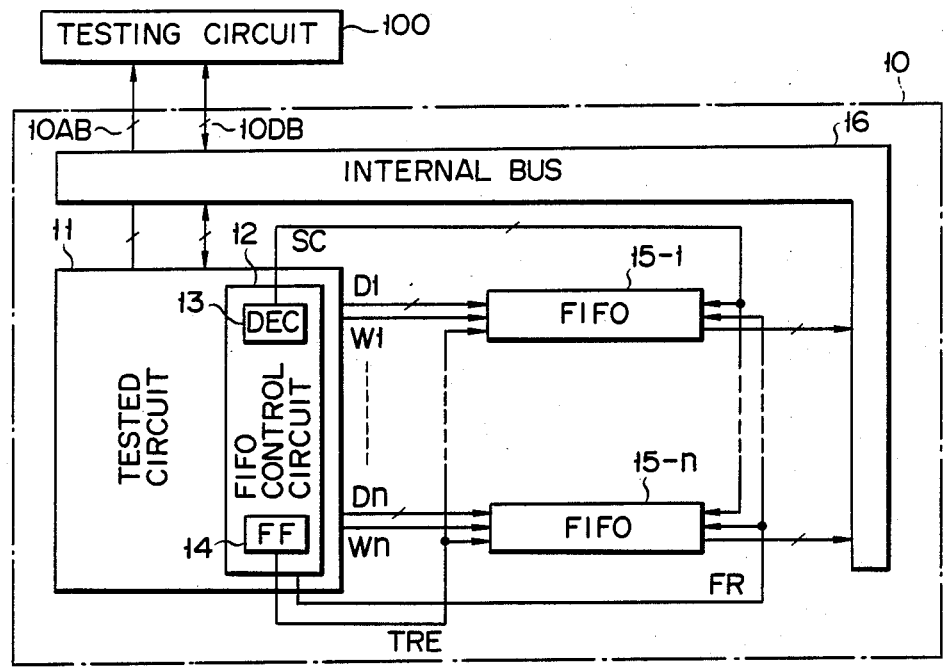
F I G. 1
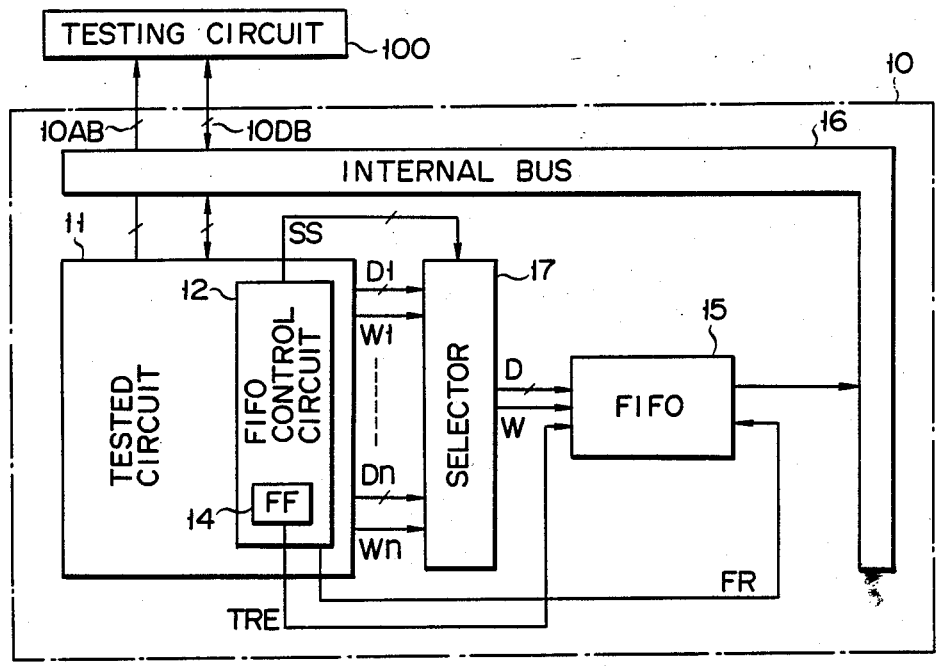
F I G. 2

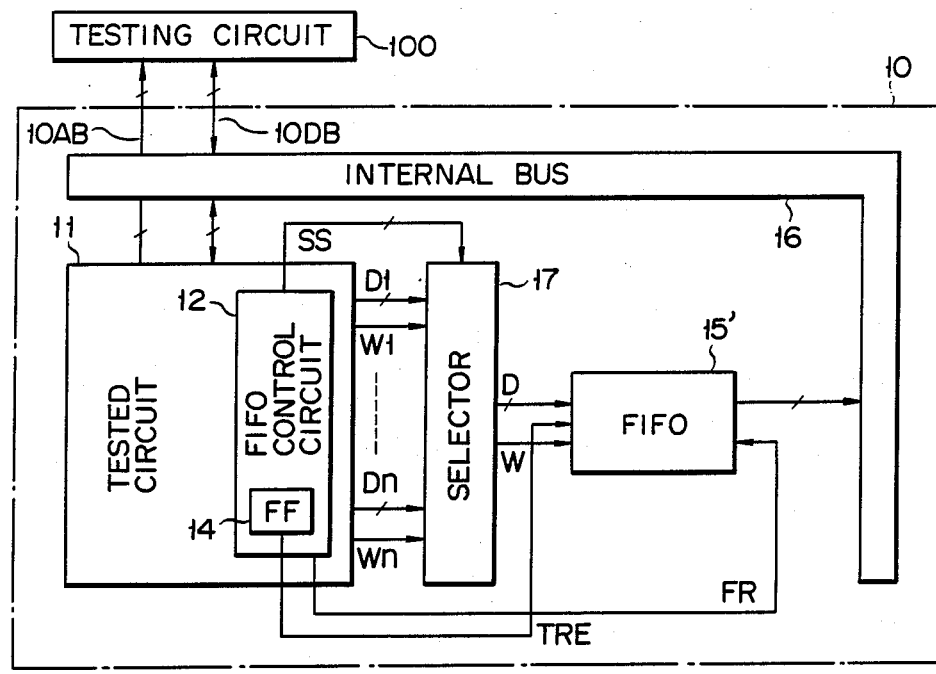
F I G. 5
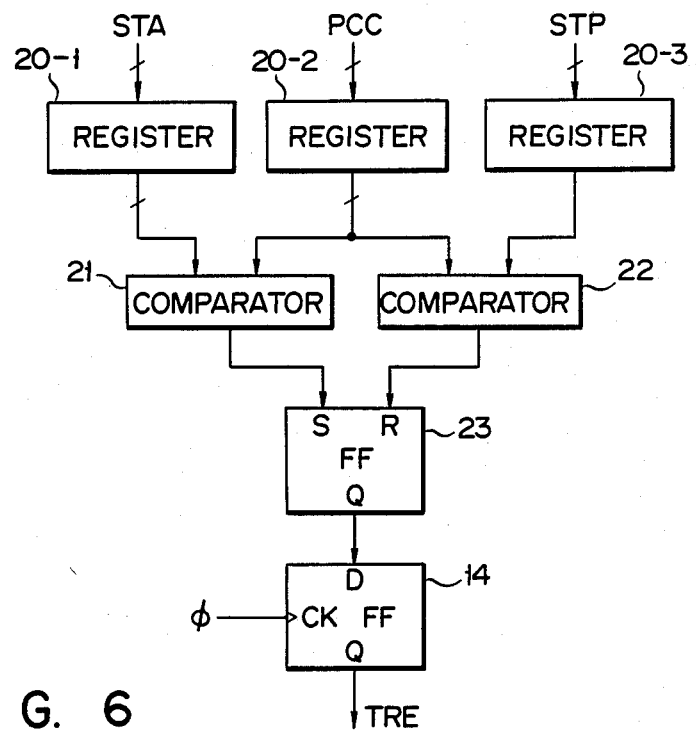
F I G. 6

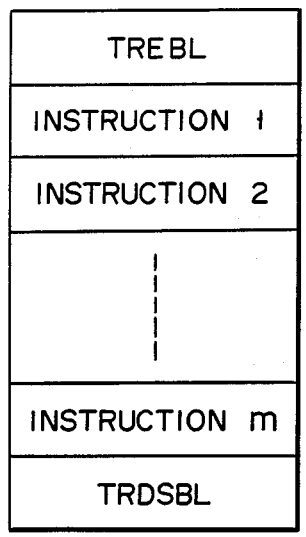
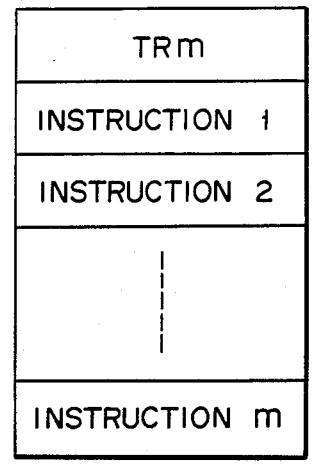
F I G. 7A     F I G. 7B

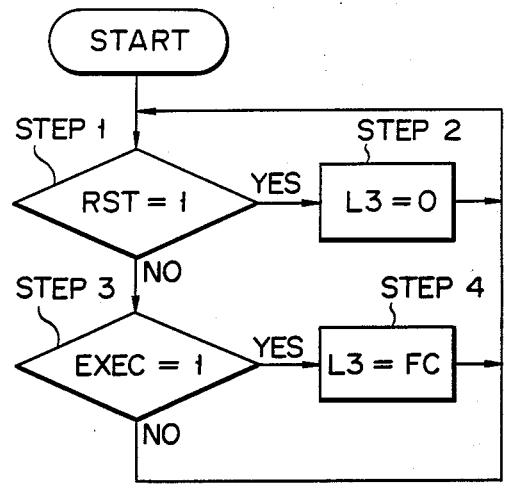
F I G. 9A
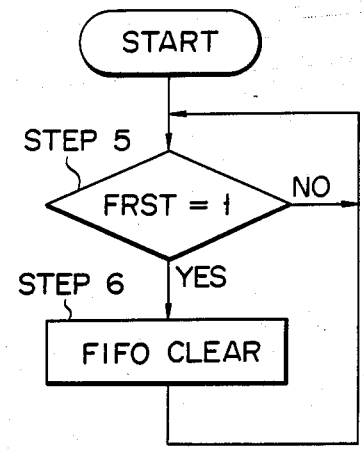
F I G. 9B
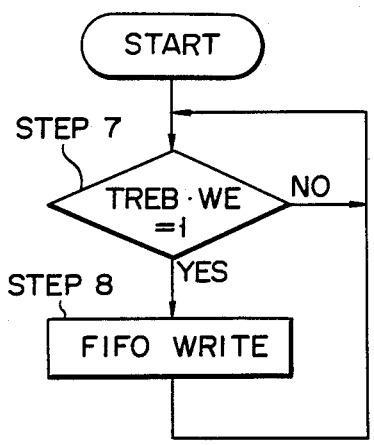
F I G. 9C
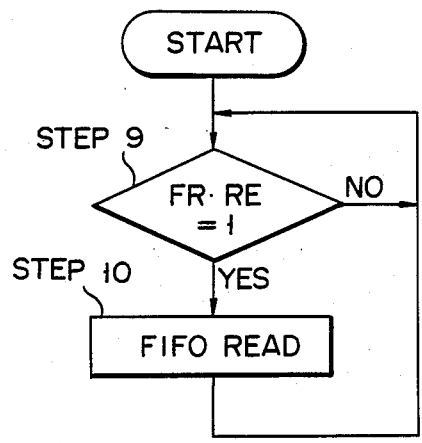
F I G. 9D

LOGIC INTEGRATED CIRCUIT CAPABLE OF SIMPLIFYING A TEST

BACKGROUND OF THE INVENTION

This invention relates to a digital integrated circuit and, more particularly, to a integrated logic circuit capable of simplifying a test.

Serial scan and random scan are both conventional well-known methods used for simplifying a test of integrated logic circuits. Using these methods, the process of reading out data from a memory element of the logic integrated circuit in a test mode is different between these methods, depending on the serial access or random access, but there is a common feature that data is read out at the same time.

However, in the case where the contents of a register (memory element) are traced in a certain period, using the methods described above, it is necessary to read out the result of tracing for each clock or instruction while the test mode and an execution mode are performed repeatedly. This necessitates complicated control operation and a long test time for the logic integrated circuit. Thus, the logic integrated circuit and test program for the logic integrated circuit using the methods described above have to be further improved.

SUMMARY OF THE INVENTION

An object of this invention is to provide an improved logic integrated circuit which permits a test to be simplified and the test time to be shortened.

The above object can be attained by way of a logic integrated circuit comprising a plurality of memory circuits which are arranged to be connected to test nodes of a circuit to be tested and into which a plurality of data can be written and from which it can be read out; a selection circuit for selecting the memory circuits; and a write-in period specifying circuit for specifying a write-in period during which data is permitted to be written into the memory circuits; wherein logic values at respective test nodes in the circuit to be tested are written into the memory circuits each time a write-in condition is satisfied during a period specified by the write-in period specifying circuit and then data is read out from one or more of the memory circuits selected by the selection circuit.

With this construction, an improved logic integrated circuit which permits a test to be simplified and the test time to be shortened can be provided.

BRIEF DESCRIPTION OF THE DRAWINGS

FIG. 1 is a circuit diagram of a logic integrated circuit according to one embodiment of this invention;

FIGS. 2, 3, 4 and 5 are diagrams of logic integrated circuits according to other embodiments of this invention;

FIG. 6 is a diagram of a circuit for generating a trace enable signal in the circuits shown in FIGS. 1 to 3 and 5;

FIGS. 7A and 7B are diagrams showing instructions used in a program for setting the trace enable period in the circuits of FIGS. 1 to 3 and 5;

FIGS. 9A to 9D are flow charts illustrating the operations of a circuit shown in FIG. 8;

DETAILED DESCRIPTION OF THE PREFERRED EMBODIMENTS

Figure 3:
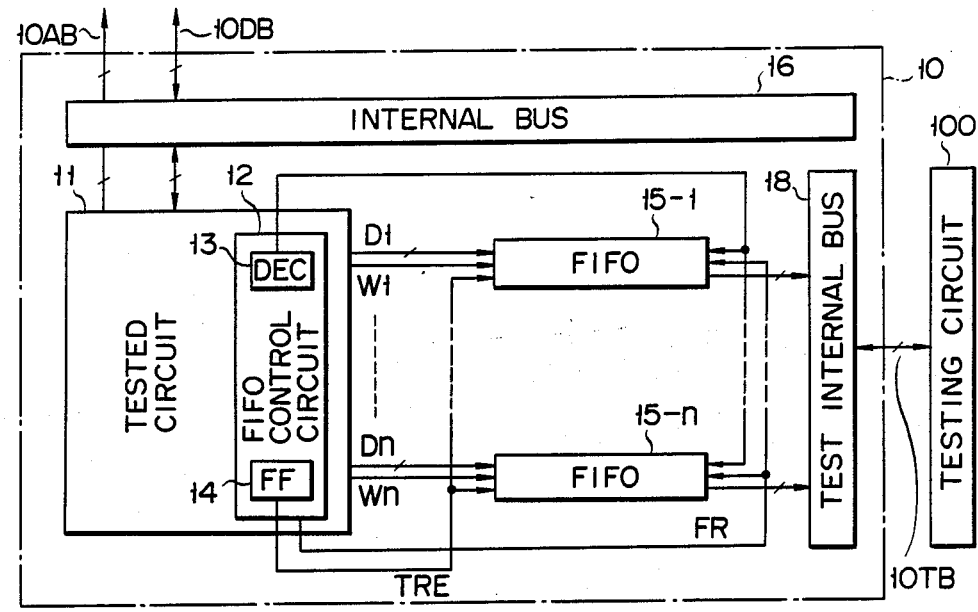

There will now be described an embodiment of this invention with reference to the drawings. FIFO control circuit 12 is provided in circuit 11 to be tested in logic integrated circuit 10 of FIG. 1. FIFO control circuit 12 includes decoder 13 and flip-flop 14. Further, in logic integrated circuit 10, FIFO type memory circuits 15-1 to 15-n such as shift registers or random access memories (RAMs) are provided. Memory circuits 15-1 to 15-n are connected to receive data D1 to Dn from the test nodes in tested circuit 11. System clocks used in tested circuit 11 or clocks from FIFO control circuit 12 are supplied as write-in signals W1 to Wn to memory circuits 15-1 to 15-n. Further, memory circuits 15-1 to 15-n are connected to receive readout signal FR supplied from FIFO control circuit 12 and trace enable signal TRE corresponding to the set/reset state of flip-flop 14. Decoder 13 generates output signal SC to select one of memory circuits 15-1 to 15-n. After the end of tracing, memory circuits 15-1 to 15-n are sequentially selected by output SC from decoder 13, permitting memory data therefrom to be supplied to external testing circuit 100 via internal bus 16 and data bus 10DB.

Now, the operation of the circuit in FIG. 1 will be explained. First, system clocks of tested circuit 11 or clocks from FIFO control circuit 12 are supplied as write-in signals W1 to Wn to memory circuits 15-1 to 15-n. This permits data D1 to Dn from the test nodes in tested circuit 11 to be supplied to the input terminals of memory circuits 15-1 to 15-n. Then, flip-flop 14 in FIFO control circuit 12 is set to supply trace enable signal TRE to memory circuits 15-1 to 15-n, causing data D1 to Dn to be respectively written into memory circuits 15-1 to 15-n. Thereafter, when flipflop 14 is reset to interrupt supply of trace enable signal TRE, the tracing operation is completed. Next, readout signal FR is supplied from FIFO control circuit 12 to memory circuits 15-1 to 15-n, setting memory circuits 15-1 to 15-n into the readout mode. Then, memory circuits 15-1 to 15-n are sequentially selected by output signal SC from decoder 13. Memory data is read out from one of memory circuits 15-1 to 15-n selected by means of decoder 13 and supplied to external testing circuit 100 via internal bus 16 and data bus 10DB, and then a next memory circuit is selected by output signal SC from decoder 13, causing memory data to be read out from the selected memory circuit in the same manner as described above. The same operation as described above is repeatedly effected to transfer all the memory data from memory circuits 15-1 to 15-n to testing circuit 100. Then, the operation condition of tested circuit 11 is checked or tested based on the data received by testing circuit 100.

With this construction, since data D1 to Dn at the respective test nodes are set into memory circuits 15-1 to 15-n and then the data are sequentially read out from memory circuits 15-1 to 15-n, the tracing operation can be continuously effected according to the number of clocks or instructions in a period specified by trace enable signal TRE. Therefore, unlike the prior art scan type testing method, it is not necessary to read out the result of tracing for each clock or instruction while the test mode and execution mode are repeatedly effected. This simplifies the control process and shortens the time for the tracing operation, and makes it possible to trace the result of the execution of a program effected on the real time basis. Further, since memory circuits 15-1 to 15-n are exclusively used for test, it is possible to trace the conditions of the bus and the intermediate nodes in combined logic circuits which cannot be tested by the prior art method. This is particularly advantageous for the development of the integrated logic circuit, making it possible to effectively improve the application program and the integrated logic circuit itself.

FIG. 2 shows another embodiment of this invention in which only one memory circuit 15 for tracing is provided. A sequence of logic values at one of test nodes selected by selector 17 is stored into memory circuit 15. In FIG. 2, the same parts as those in FIG. 1 are denoted by the same reference numerals and the detail explanation therefor are omitted. With this construction, selector 17 selects one of the test nodes in test circuit 11 in response to selection control signal SS supplied from FIFO control circuit 12, permitting data at only the selected test node to be stored into memory circuit 15. In the FIG. 1 embodiment, data D1 to Dn at all the test nodes in tested circuit 11 are stored in memory circuits 15-1 to 15-n, and data of the memory circuits are sequentially read out and supplied to testing circuit 100. In contrast, in the FIG. 2 embodiment, the test nodes are sequentially selected and a corresponding data D1 to Dn at the selected test node are sequentially stored into memory circuit 15. Then, the data stored in memory circuit 15 are transferred one by one to testing circuit 100 via internal bus 16 and data bus 10DB. Thus, only one memory circuit 15 is satisfactory, and memory circuit 15 is effectively used to trace the condition of the test nodes in tested circuit 11.

In an embodiment of FIG. 3, internal bus 18 exclusively used for test is provided in logic integrated circuit 10 in addition to the circuit of FIG. 1. Data stored in memory circuits 15-1 to 15-n are transferred to testing circuit 100 via internal test bus 18 and test data bus 10TB which are exclusively used for test. The operational difference between the FIG. 1 circuit and the FIG. 3 circuit is that internal test bus 18 is used exclusively for test and internal bus 16 is used to transfer data D1 to Dn to testing circuit 100. The operation of the respective buses is basically the same. Thus the same results can be obtained for the embodiments of FIG. 1 and FIG. 3. In the case where internal test bus 18 and test data bus 10TB are used only for testing and are provided as shown in FIG. 3, each of buses 18 and 10TB can be constituted by an n-bit data bus to permit data D1 to Dn to be read out from all the memory circuits 15-1 to 15-n at the same time. This further shortens the test time as compared with the circuit in FIG. 1.

Figure 4:
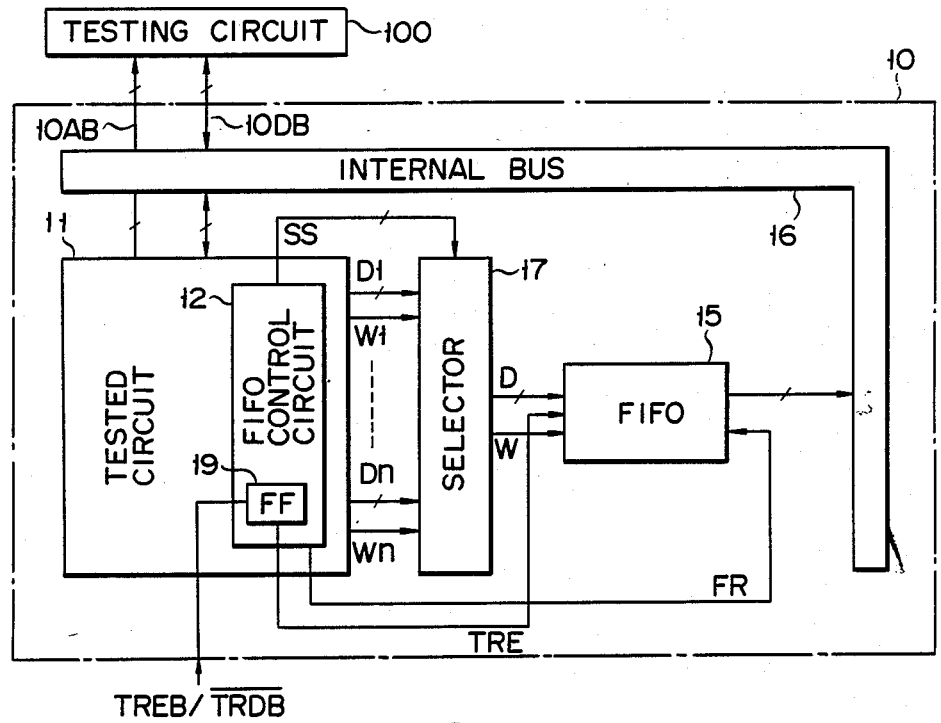

An embodiment of FIG. 4 is basically the same as that of FIG. 2, except that in the embodiments of FIG. 2 the set and reset states of flip-flop 19 in FIG. 2 are determined by externally supplied control input signals TREB (trace enable signal) and $\overline{TRDB}$ (trace disable signal) in order to specify the trace enable period. In this embodiment, if control input signal TREB/$\overline{TRDB}$ is at "1" level, a trace permissible mode is set and if is it at "0" level, then a trace inhibition mode is set.

FIG. 5 shows still another embodiment of this invention having a construction similar to that of the FIG. 2 embodiment. In this embodiment, memory circuit 15' having a serial input port and a parallel output port is used as a tracing memory circuit. Use of serial input/parallel output type memory circuit 15' makes it possible to enhance the readout efficiency. With the circuits of FIGS. 2 to 5, the control process can be simplified and the tracing time can be shortened in the same manner as in the circuit of FIG. 1.

FIG. 6 shows a circuit for generating trace enable signal TRE in FIGS. 1 to 3 and 5. Part of the circuit of FIG. 6 is an example of a control circuit for flip-flop 14 in FIGS. 1 to 3 and 5. In the control circuit, data STA specifying the staring point of the tracing is supplied from the exterior and set into register 20-1. Count PCC of a program counter (not shown) provided in tested circuit 11, for example, is supplied to and stored in register 20-2. Further, data STP specifying the end point of the tracing is supplied from the external and stored in register 20-3. Data stored in registers 20-1 and 20-2 are supplied to and compared with each other by comparator 21. Data stored in registers 20-2 and 20-3 are supplied to and compared with each other by comparator 22. Comparison output signals from comparators 21 and 22 are respectively supplied to set input terminal S and reset input terminal R of flip-flop 23. A signal from output terminal Q of flip-flop 23 is supplied to data input terminal D of flip-flop 14 which generates trace enable signal TRE from output terminal Q in response to clock $\phi$. Flip-flop 14 is set active when count PCC stored in register 20-2 coincides with data STA stored in register 20-1, and is set nonactive when count PCC stored in register 20-2 coincides with data STP stored in register 20-3.

FIGS. 7A and 7B are diagrams for explaining the case where the trace enable period is set by executing a program according to instructions of tested circuit 11. In the FIG. 6 circuit, comparators 21 and 22 and flip-flops 14 and 23 are used to generate trace enable signal TRE. In contrast, the trace enable period is determined by trace starting instruction TREBL and trace end instruction TRDSBL used in tested circuit 11 shown in FIG. 7A. Instruction 1 to instruction m are executed between executions of trace starting instruction TREBL and trace end instruction TRDSBL. Instruction TRm specifying the number m of trace instructions can be used to serve the same purpose. As shown in FIG. 7B, for example, instruction 1 to instruction m can be executed after the execution of instruction TRm specifying the number m of trace instructions.

Figure 8:
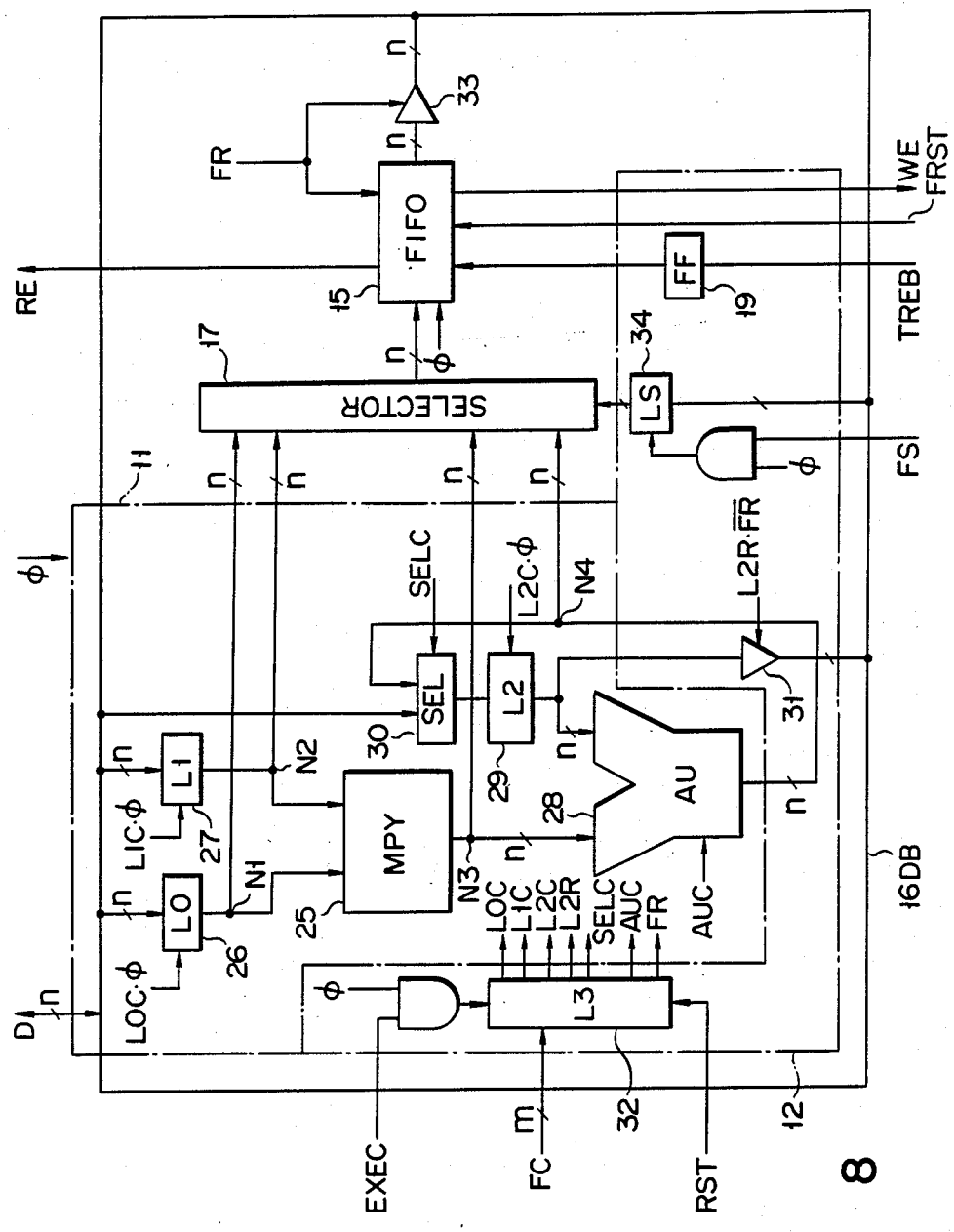
FIG. 8 is a circuit diagram showing the detailed construction of a circuit shown in FIG. 4.

FIG. 8 shows a detailed circuit construction of one example of the FIG. 4 circuit. In this example, tested circuit 11 is composed of multiplier (MPY) 25, two latch circuits (L1 and L0) 26 and 27, arithmetic operation unit (AU) 28, latch circuit (L2) 29 and two-input selection circuit (SEL) 30. Output terminals N1 and N2 of latch circuits 26 and 27, output terminal N3 of multiplier 25 and output terminal N4 of arithmetic operation unit 28 are determined as test nodes. Signals derived from output terminals N1 to N4 are supplied to selector 17. Multiplier 25 multiplies input operands held in latch circuits 26 and 27 and supplies the multiplication result as one of operands to arithmetic operation unit 28 which receives an output signal of latch circuit 29 as the other input operand. The operation result of arithmetic unit 28 is fed back to the input terminal of latch circuit 29 via two-input selection circuit 30.

Input data to latch circuits 26 and 27 are received via internal data bus 16DB in synchronism with clock $\phi$. Output data of latch circuit 29 can be transferred to internal data bus 16DB via buffer 31. Function code FC held in latch circuit (L3) 32 is used to determine whether or not the contents of latch circuits are updated, whether or not the contents of latch circuit 29 are supplied to internal bus 16DB, input data to be selected by two-input selection circuit 30, and the operation to be performed by arithmetic operation unit 28. Function code FC includes control signal L0C for latch circuit 26 (logical product signal L0C·φ which is the logical product of signal L0C and clock φ is used to control latch circuit 26), control signal L1C for latch circuit 27 (logical product signal L1C·φ which is the logical product of signal L1C and clock φ is used to control latch circuit 27), control signal L2C for latch circuit 29 (logical product signal L2C·φ which is the logical product of signal L2C and clock φ is used to control latch circuit 29), control signal L2R for controlling buffer 31 (logical product signal L2R· $\overline{FR}$ which is the logical product of signal L2R and inverted signal $\overline{FR}$ of readout signal FR is used to control buffer 31), selection signal SELC for two-input selection circuit 30, control signal AUC for arithmetic operation unit 28, and readout signal FR for controlling memory circuit 15, buffers 31 and 33. The contents of latch circuit 32 are updated in synchronism with clock φ when external control signal EXEC for permitting function code FC to be received is at "1" level, and are cleared by external control signal RST used as a reset signal.

In the circuit of FIG. 8, test nodes N1 to N4 to be traced are selectively specified by selecting one of output terminals of latch circuits 26 and 27, multiplier 25 and arithmetic operation unit 28 by selector 17. The specifying operation is triggered in response to an output signal of latch circuit (LS) 34. The contents of latch circuit 34 are replaced by data on internal data bus 16DB in synchronism with clock φ under a control of external control signal FS.

Data on the test node selected by selector 17 can be written into memory circuit 15 only when write enable signal WE generated from memory circuit 15 is at "1" level. When write enable signal WE is at "1" level, the write-in operation is specified by external control signal (trace enable signal) TREB.

The operation of reading out memory data from memory circuit 15 can be effected only when read enable signal RE generated from memory circuit 15 is at "1" level. When read enable signal RE is at "1" level, readout signal FR latched in latch circuit 32 is set to "1" level to specify the readout operation.

In the circuit of FIG. 8, the tracing operation is effected as follows. First, the contents of latch circuit 32 are cleared by external control signal RST and memory data of memory circuit 15 is cleared by external control signal FRST. Then, external control signal FS is set to "1" level and the contents of latch circuit 34 are replaced by data on internal data bus 16DB to specify the test node to be traced. After this, external control signal EXEC is set to "1" level, permitting function code FC to be supplied to and set into latch circuit 32. Instructions necessary for effecting a sequence of operations are supplied from latch circuit 32 to latch circuits 26, 27 and 29, two-input selection circuit 30 and buffer 31. The operation is proceeded by updating function code FC for each clock φ. FIG. 9A is a flow chart for showing the operation. In step 1, whether reset signal RST is "1" or not is checked. If signal RST is "1", a signal "0" is supplied to clear latch circuit 32 in step 2. If it is detected in step 1 that reset signal RST is not "1", then it is checked in step 3 whether external control signal EXEC is "1" or not. If external control signal EXEC is "1", function code FC is set in latch circuit 32 in step 4. If it is detected in step 3 that external control signal EXEC is not "1", the process is returned to step 1.

Next, memory data in memory circuit 15 is cleared. The operation is effected as shown in FIG. 9B. First, it is checked in step 5 whether or not external control signal FRST for clearing memory data of memory circuit 15 is "1". If yes, step 6 is effected to clear memory data of memory circuit 15. On the other hand, if external control signal FRST is not "1", the process is returned to step 5.

In order to store data indicating the state of the test node during the operation into memory circuit 15 and trace the state of the test node, it is first determined that write enable signal WE is at "1" level. Then, trace enable signal TREB is set to "1" level to set trace enable mode. This causes states data at the test node specified by latch circuit 34 to be stored into memory circuit 15 via selector 17 in synchronism with clock φ. When data is stored to a full capacity of memory circuit 15, write enable signal WE generated from memory circuit 15 is set to "0" level, thereby setting trace enable signal TREB to "0" level to inhibit the data write-in into memory circuit 15. Further, when clocks of the number necessary for the tracing have been generated, trace enable signal TREB is set to "0" level to inhibit the tracing operation even if write enable signal WE is at "1" level. FIG. 9C is a flow chart showing the write-in operation. First, it is checked in step 7 whether the logical product TREB·WE of trace enable signal TREB and write enable signal WE is "1" or not. If the logical product is "1", data on the test node is written into memory circuit 15 in step 8. When the logic product is detected to be not "1" in step 7, the process is returned to step 7.

In order to read out data from memory circuit 15, readout signal FR of function code FC is set to "1" level, causing memory data of memory circuit 15 to be read out onto internal data bus 16DB in synchronism with clock φ. In this case, when output buffer 33 connected to the output port of memory circuit 15 is set operative, output buffer 31 connected to the output port of latch circuit 29 is set nonoperative. Therefore, output data will not collide with each other on internal data bus 16DB. FIG. 9D is a flow chart showing the readout operation. It is first checked in step 9 whether the logical product FR·RE of readout signal FR and read enable signal RE is "1" or not. When the logical product is "1", data on the test node is read out from memory circuit 15 in step 10. If it is detected in step 9 that the logical product is not "1", the process is returned to step 9.

In the example described above, readout signal FR is obtained as a latch output signal of function code FC, but it is possible to derive readout signal FR from an externally supplied control signal. Further, in the case where trace enable signal TREB is supplied in the form of pulse, it is necessary to use flip-flop 19. However, if trace enable signal TREB is supplied as a level signal, flip-flop 19 can be omitted.

Figure 10:
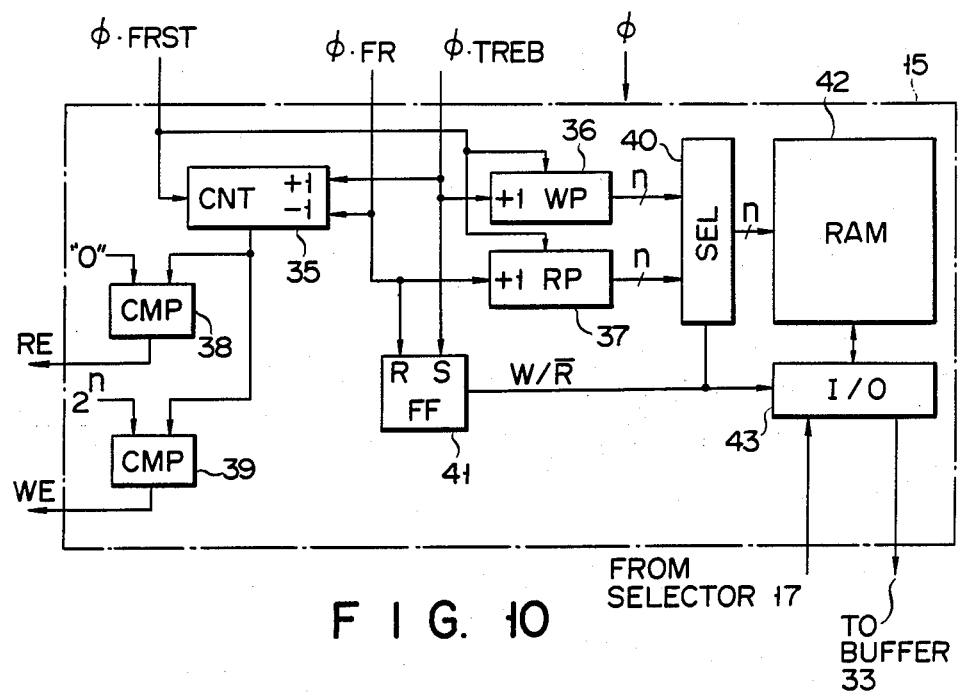
FIG. 10 is a circuit diagram showing the construction of a memory circuit in a circuit of FIG. 8.

FIG. 10 shows the construction of memory circuit 15 in the circuit of FIG. 8. External control signal φ·FRST (the logical product of clock φ and external control signal FRST) which is generated in synchronism with clock φ to clear memory data of memory circuit 15 is supplied to (n +1)-bit FIFO counter 35, n-bit write pointer 36 and n-bit read pointer 37. The count in counter 35 is incremented by one in response to trace enable signal φ·TREB (the logical product of clock φ and trace enable signal TREB) which is generated in synchronism with clock φ and decremented by one in response to readout signal φ·FR (the logical product of clock φ and readout signal FR) which is generated in synchronism with clock φ. The count of counter 35 is supplied to one input terminal of comparator 38 which is connected to receive a "0" level signal at the other input terminal. When the count of counter 35 is not equal to the "0" level signal, comparator 38 generates readout enable signal RE of "1" level. The count of counter 35 is also supplied to one input terminal of comparator 39 which is connected to receive numeral data of $2^n$ at the other input terminal. When the count of counter 35 is not equal to the numeral data, comparator 39 generates write enable signal WE of "1" level. Trace enable signal φ·TREB is supplied to write pointer 36 to increment the write-in address by one. Readout signal φ·FR is supplied to read pointer 37 to increment the readout address by one. Output signals of write pointer 36 and read pointer 37 are supplied to selector 40. Selector 40 selects write pointer 36 or read pointer 37 when output signal W/$\overline{R}$ of flip-flop 41 is at "1" or "0" level, respectively. The address selected by selector 40 is supplied to RAM 42. RAM 42 includes ($2^n+1$) memory cells each of which is selectively energized in response to an n-bit address signal from selector 40. Flip-flop 41 is set by trace enable signal φ·TREB and reset by readout signal φ·FR. An output signal of flip-flop 41 is supplied to input/output circuit 43. The data writein and readout operations with respect to RAM 42 are controlled by means of I/0 circuit 43. When output signal W/$\overline{R}$ of flip-flop 41 is at "1" level, data supplied from selector 17 is written into a memory location of RAM 42 designated by the address selected by selector 40. When output signal W/$\overline{R}$ is at "0" level, data stored in RAM 42 is read out from a memory location designated by the address selected by selector 40. Data thus read out is supplied to buffer 33 shown in FIG. 8.

Figure 11:
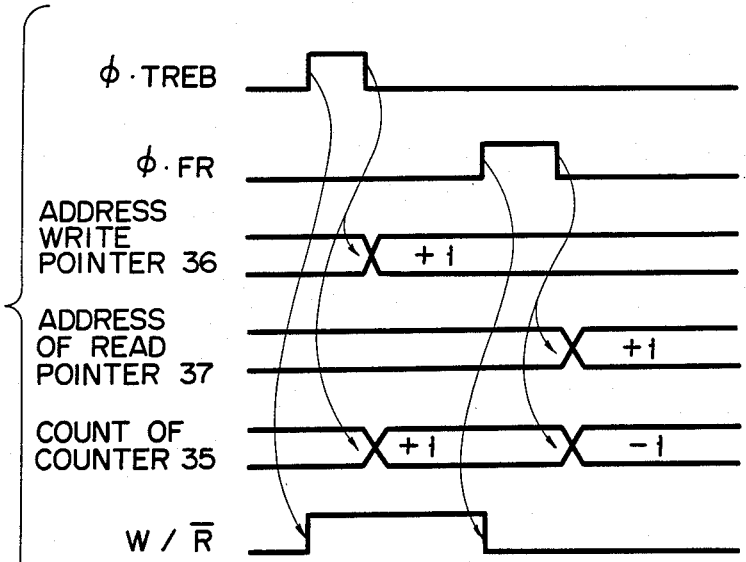
FIG. 11 is a timing chart for illustrating the operation of a circuit shown in FIG. 10.

FIG. 11 is a timing chart for illustrating the operation of the circuit shown in FIG. 10. When trace enable signal TREB rises to a "1" level, flip-flop 41 is set to produce output signal W/$\overline{R}$ of "1" level. This causes data on the test node selected by selector 17 to be written into RAM 42 via I/0 circuit 43. When trace enable signal TREB becomes "0" level, the content of write pointer 36 is incremented by one and the count of counter 35 is incremented by one count. Then, when readout signal FR rises to "1" level, flip-flop 41 is reset to produce output signal W/$\overline{R}$ of "0" level. This causes data stored in 42 to be read out and supplied to buffer 33 via I/O circuit 43. When readout signal FR is set to "0" level, the content of read pointer 37 is incremented by one and the count of counter 35 is decremented by one count. When the count of counter 35 is reduced to "0", output signal (read enable signal) RE from comparator 38 is set to "0" level. Further, when the count of counter 35 becomes $2_n$, output signal (write enable signal) WE from comparator 39 is set to "0" level.

Figure 12:
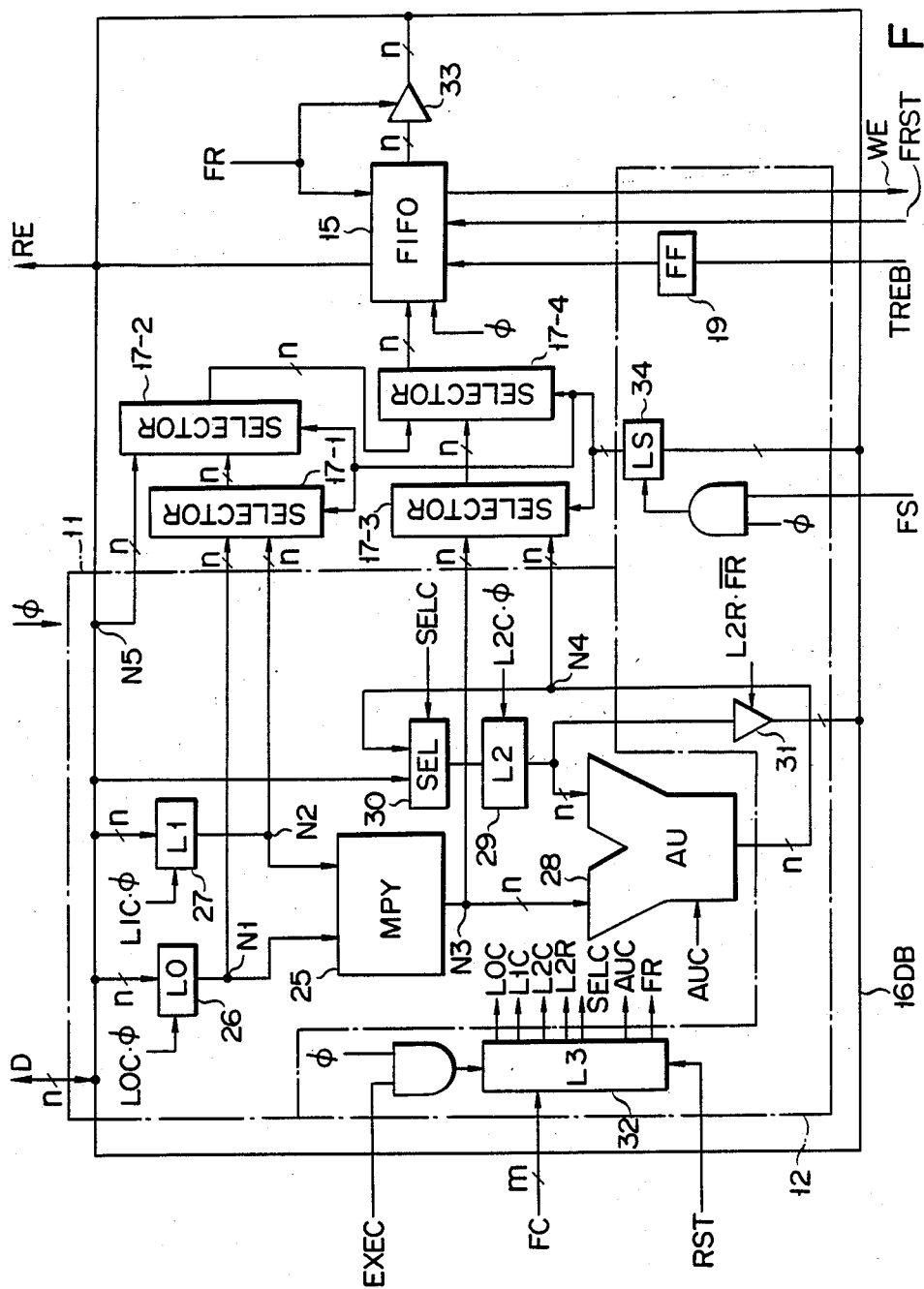
FIG. 12 is a circuit diagram showing a different construction of a circuit in FIG. 4.

FIG. 12 shows a circuit construction of another example of the FIG. 4 circuit. In FIG. 12, portions which are the same as those in the circuit of FIG. 8 are denoted by the same reference numerals. The FIG. 12 circuit is similar to the FIG. 8 circuit except that a plurality of selectors 17-1 to 17-4 for selecting a signal supplied to memory circuit 15 are connected in a tree form and test node N5 is additionally provided on internal data bus 16DB.

The circuit of this construction provides the same operation and effect as those in the FIG. 8 circuit. Further, each of selectros 17-1 to 17-4 is required only to select one of the two test nodes, and therefore the construction thereof can be simplified and the number of wiring lines can be reduced.

As described above, in this invention, the tracing operation can be continuously effected by a number of times corresponding to the number of clocks or instructions. Therefore, unlike the prior art scan type method, it is not necessary in this invention to read out the result for each clock or instruction while the test mode and execution mode are repeatedly effected. Owing to this the control process can be simplified and the tracing time can be shortened. Further, the result of execution of program effected in real time can be traced, and the state of buses and intermediate nodes in a combined logic circuit which has been difficult to trace with the prior art scan type method can be easily traced. Thus, this invention is particularly advantageous for the development of the logic integrated circuit, and the application program and logic integrated circuit itself can be further improved.

What is claimed is:

1. A logic integrated circuit comprising:
a tested circuit to be inspected;
a plurality of memory means of a FIFO memory type each of which have input terminals connected to respective test nodes of said tested circuit, for storing logical values from corresponding, respective test nodes, in response to commands executed by said tested circuit; and
control means for controlling storage of the logical values in each of said plurality of memory means and read-out of the stored logical values from each of said plurality of memory means, said control means including decoder means, connected to said plurality of memory means, for selecting one of said plurality of memory means to read-out stored logical values from said one of said plurality of memory means and flip-flop means, connected to said plurality of memory means, for specifying a period during which corresponding logical values are stored in said respective memory means, and said control means successively storing the logical values at corresponding test nodes of said tested circuit in said memory means each time a write-in condition is satisfied during a period specified by said flip-flop means and for reading out data, after the end of write-in, from said memory means selected by said decoder means.

2. A logic integrated circuit according to claim 1, wherein said memory means comprises a shift register.

3. A logic integrated circuit according to claim 1, wherein said memory means comprises a RAM.

4. A logic integrated circuit according to claim 1, wherein said memory means comprises a serial input/parallel output type memory circuit.

5. A logic integrated circuit according to claim 1, wherein said flip-flop means is selectively set and reset in response to an externally supplied control input signal.

6. A logic integrated circuit comprising:
a tested circuit to be inspected;
a node selection means connected to test nodes of said tested circuit, for selecting one of said test nodes;

memory means of a FIFO memory type connected to said node selection means, for storing a logical value at a test node selected by said node selection means, data being inhibited from being written in said memory means by executing a command of said tested circuit; and control means for controlling said node selection means and said memory means, said control means including write-in period specifying means, connected to said memory means, for specifying a period during which the logical value is written in said memory means, and said control means writing the logical values at the test nodes selected by said node selection means in said memory means each time a write-in condition is satisfied during a period specified by said write-in period specifying means and, after the end of write-in, reading out data from said memory means.

7. A logic integrated circuit according to claim 6, wherein said memory means includes shift register.

8. A logic integrated circuit according to claim 6, wherein said memory means includes a RAM.

9. A logic integrated circuit according to claim 6, wherein said memory means comprises a serial input/parallel output type memory circuit.

10. A logic integrated circuit according to claim 6, wherein said node selection means comprises a selector.

11. A logic integrated circuit according to claim 6, wherein said write-in period specifying means comprises a flip-flop.

12. A logic integrated circuit according to claim 6, wherein said write-in period specifying means comprises a flip-flop which is set or reset in response to an externally supplied control input signal.

* * * * *